US011263380B2

(12) United States Patent
Tang et al.

(10) Patent No.: US 11,263,380 B2
(45) Date of Patent: Mar. 1, 2022

(54) FAILSAFE CIRCUIT, LAYOUT, DEVICE, AND METHOD

(71) Applicants: TAIWAN SEMICONDUCTOR MANUFACTURING COMPANY LTD., Hsinchu (TW); TSMC CHINA COMPANY, LIMITED, Shanghai (CN)

(72) Inventors: Zhen Tang, Shanghai (CN); Lei Pan, Shanghai (CN); Miranda Ma, Shanghai (CN)

(73) Assignees: TAIWAN SEMICONDUCTOR MANUFACTURING COMPANY, LTD., Hsinchu (TW); TSMC CHINA COMPANY, LIMITED, Shanghai (CN)

( * ) Notice: Subject to any disclaimer, the term of this patent is extended or adjusted under 35 U.S.C. 154(b) by 476 days.

(21) Appl. No.: 16/237,165

(22) Filed: Dec. 31, 2018

(65) Prior Publication Data

US 2020/0082050 A1 Mar. 12, 2020

(30) Foreign Application Priority Data

Sep. 10, 2018 (CN) .......................... 201811051924.9

(51) Int. Cl.
*G06F 30/398* (2020.01)
*G05F 1/625* (2006.01)
(Continued)

(52) U.S. Cl.
CPC ............. *G06F 30/398* (2020.01); *G03F 1/36* (2013.01); *G03F 1/70* (2013.01); *G05F 1/625* (2013.01)

(58) Field of Classification Search
CPC ........... H03K 19/007; G03F 1/36; G03F 1/70; G05F 1/625; G06F 30/398
See application file for complete search history.

(56) References Cited

U.S. PATENT DOCUMENTS 5,754,480 A 5/1998 Sato
7,260,442 B2 8/2007 Hwang et al.
(Continued)

FOREIGN PATENT DOCUMENTS

| CN | 101305287 | 11/2008 |
|---|---|---|
| CN | 105680680 | 6/2016 |

(Continued)

OTHER PUBLICATIONS

Office Action dated Jul. 21, 2020 from corresponding application No. KR 10-2019-0112357.
(Continued)

*Primary Examiner* — Jack Chiang
*Assistant Examiner* — Aric Lin
(74) *Attorney, Agent, or Firm* — Hauptman Ham, LLP

(57) ABSTRACT

A circuit includes a reference node configured to carry a reference voltage level, a first node configured to carry a signal having a first voltage level or the reference voltage level, a second node configured to carry a power supply voltage having a power supply voltage level in a power-on mode and the reference voltage level in a power-off mode, and a plurality of transistors coupled in series between the first node and the reference node. Each transistor of the plurality of transistors receives a corresponding control signal of a plurality of control signals, and each control signal has a first value based on the power supply voltage in the power-on mode and a second value based on the signal in the power-off mode.

20 Claims, 11 Drawing Sheets

(51) Int. Cl.
*G03F 1/70* (2012.01)
*G03F 1/36* (2012.01)

(56) References Cited

U.S. PATENT DOCUMENTS

| | | | |
|---|---|---|---|
| 9,256,709 | B2 | 2/2016 | Yu et al. |
| 2002/0041215 | A1* | 4/2002 | Kiyose ............... H03L 7/0995 331/57 |
| 2002/0080133 | A1* | 6/2002 | Eu ..................... G09G 3/3648 345/212 |
| 2004/0017696 | A1* | 1/2004 | Allen .................. G11C 7/1069 365/189.05 |
| 2011/0089916 | A1* | 4/2011 | Soenen ................. G05F 1/575 323/280 |
| 2013/0182353 | A1 | 7/2013 | Schieke |
| 2014/0040838 | A1 | 2/2014 | Liu et al. |
| 2015/0061734 | A1* | 3/2015 | Ogawa .......... H03K 19/018521 327/143 |
| 2015/0180473 | A1* | 6/2015 | Amadi ............ H03K 3/356182 326/81 |
| 2015/0263722 | A1* | 9/2015 | Kim .................... G09G 3/3266 315/161 |
| 2015/0278429 | A1 | 10/2015 | Chang |
| 2015/0340854 | A1 | 11/2015 | Richter et al. |

FOREIGN PATENT DOCUMENTS

| | | |
|---|---|---|
| CN | 207676230 | 7/2018 |
| JP | H08223024 | 8/1996 |
| JP | 2004356778 | 12/2004 |
| JP | 2007195238 | 8/2007 |
| JP | 2015222520 | 12/2015 |
| TW | 201108542 | 3/2011 |
| TW | 201 115921 | 5/2011 |
| WO | WO2018030276 | 2/2018 |

OTHER PUBLICATIONS

Notice of Allowance dated Jan. 6, 2021 for corresponding application KR 10-2019-0112357. (pp. 1-6).
Office Action dated May 19, 2020 from corresponding application No. TW 108131741.

* cited by examiner

FAILSAFE CIRCUIT, LAYOUT, DEVICE, AND METHOD

BACKGROUND

Communication between electronic circuits involves a variety of scenarios that must be taken into account when a circuit is designed. In some cases, a circuit that relies on one power source must be designed to interface with signals based on another power source. The two power sources might not have the same voltage level, and one of the two power sources could be powered-on while the other is powered-off.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
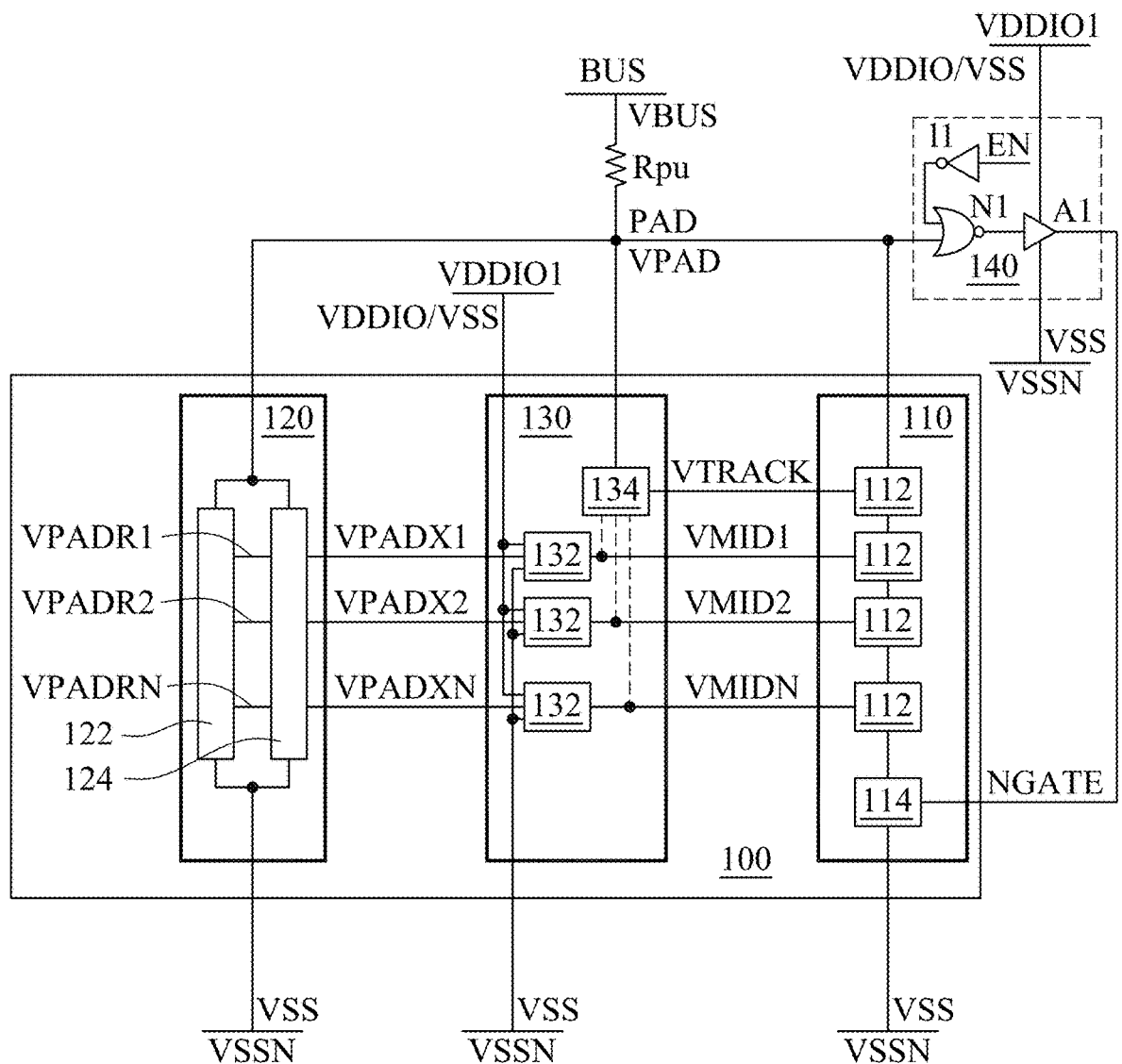
FIG. 1 is a diagram of a circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a circuit includes a series of switching devices coupled between a node and a reference node and responsive to a plurality of control signals. A signal on the node is divided to generate one or more gate voltages that are received by a gate control circuit. The gate control circuit also receives the signal and a power supply voltage of the circuit. In a power-on mode, the gate control circuit outputs each of the control signals having at least one value based on the power supply voltage. In a power-off mode, the gate control circuit outputs each of the control signals having at least one value based on the signal.

The circuit is thereby configured as an input-output (I/O) circuit capable of communicating the signal in the power-on mode and as a failsafe circuit capable of preventing leakage current from flowing in the power-off mode in applications in which the signal has a voltage level greater than or equal to the power supply voltage level. By limiting voltages across the switching devices to magnitudes at or below a maximum operating voltage of the switching devices, the circuit is further capable of communicating signals and preventing leakage using switching devices having a maximum operating voltage less than the voltage level of the signal.

FIG. 1 is a diagram of a circuit 100, in accordance with some embodiments. In addition to circuit 100, FIG. 1 depicts a reference node VSSN, a node VDDIO1, a node PAD electrically coupled with a node BUS through a resistor Rpu, and a signal conditioner 140. Circuit 100 includes a pull-down circuit 110, a voltage regulator 120, and a gate control circuit 130, each of which is electrically coupled between node PAD and reference node VS SN. Gate control circuit 130 is also electrically coupled with node VDDIO1.

Two or more circuit elements are considered to be electrically coupled based on a direct electrical connection, a resistive or reactive electrical connection, or an electrical connection that includes one or more additional circuit elements and is thereby capable of being controlled, e.g., made resistive or open by a transistor or other switching device.

In the embodiment depicted in FIG. 1, each of pull-down circuit 110, voltage regulator 120, and gate control circuit 130 is directly connected to each of node PAD and reference node VSSN, and gate control circuit 130 is directly connected to node VDDIO1. In various embodiments, one or more additional circuit elements, e.g., a switching device, is coupled between one or more of pull-down circuit 110, voltage regulator 120, or gate control circuit 130 and one or both of node PAD or reference node VSSN, and/or between gate control circuit 130 and node VDDIO1.

Node VDDIO1 is a circuit node configured to carry a power supply voltage having a power supply voltage level VDDIO. In some embodiments, power supply voltage level VDDIO is a power supply voltage level of an IC chip that includes circuit 100. In some embodiments, power supply voltage level VDDIO is a power supply voltage level of an I/O portion of an IC chip that includes circuit 100.

Reference node VSSN is a circuit node configured to carry a reference voltage having a reference voltage level VSS. In some embodiments, reference voltage level VSS is a ground voltage level.

Node VDDIO1 has power supply voltage level VDDIO when circuit 100 is in a power-on mode and reference voltage VSS when circuit 100 is in a power-off mode. The power-on mode is an operating mode that corresponds to normal operation of circuit 100 based on power received from a power source (not shown), and the power-off mode is an operating mode that corresponds to circuit 100 not receiving the power from the power source.

In various embodiments, circuit 100 not receiving the power from the power source in the power-off mode corresponds to the power source being switched off or disconnected from circuit 100, to circuit 100 being switched into a sleep mode, or to another scenario that results in node VDDIO1 having reference voltage VSS.

In various embodiments, the power source is configured to deliver power directly to node VDDIO1 or through one or more intermediate circuits such as a control or step-up or step-down circuit configured to output power supply voltage level VDDIO and/or reference voltage level VSS.

In some embodiments, circuit 100 is part of an IC chip, node BUS is a power supply node of an inter-integrated circuit (IIC) bus, resistor Rpu is a pull-up resistor of the IIC bus, and node PAD is an input and/or output node through which the IC chip communicates over the IIC bus. In various embodiments, the IC chip communicates over the IIC bus by sending and/or receiving one or more signals, e.g., a signal VPAD, to and/or from one or more additional IC chips (not shown).

In some embodiments, circuit 100 is included in an I/O circuit of an IC that is coupled with an IIC bus. In some embodiments, circuit 100 is part of an IC chip that is not coupled with an IIC bus, node BUS, or resistor Rpu.

In some embodiments, the IIC bus includes node BUS configured to carry a bus voltage having a bus voltage level VBUS, and node PAD configured to carry signal VPAD having either bus voltage level VBUS or reference voltage level VSS. In various embodiments, node PAD is configured to carry signal VPAD having a voltage level less than, substantially equal to, or greater than power supply voltage level VDDIO.

In the embodiment depicted in FIG. 1, pull-down circuit 110, voltage regulator 120, and gate control circuit 130 are separate circuit regions. In various embodiments, two or more of pull-down circuit 110, voltage regulator 120, or gate control circuit 130 are integrated into a single circuit region. In various embodiments, pull-down circuit 110, voltage regulator 120, and gate control circuit 130 are included in a single IC chip, or one of pull-down circuit 110, voltage regulator 120, or gate control circuit 130 is included in an IC chip separate from one or more additional IC chips that include one or more of the other of pull-down circuit 110, voltage regulator 120, or gate control circuit 130.

Pull-down circuit 110 is an electronic circuit configured to receive control signals VTRACK and VMID1-VMIDN, and a signal NGATE, and to control node PAD in both the power-on and power-off modes responsive to control signals VTRACK and VMID1-VMIDN, and signal NGATE. Voltage regulator 120 is an electronic circuit configured to output N gate signals VPADX1-VPADXN responsive to signal VPAD on node PAD, and gate control circuit 130 is an electronic circuit configured to receive gate signals VPADX1-VPADXN and to output control signals VTRACK and VMID1-VMIDN responsive to gate signals VPADX1-VPADXN, the power supply voltage on node VDDIO1, and signal VPAD on node PAD.

In the embodiment depicted in FIG. 1, N is greater than 1 such that circuit 100 includes pluralities of each of control signals VMID1-VMIDN and gate signals VPADX1-VPADXN. In some embodiments, N is equal to 1 such that circuit 100 includes a single control signal VMID1 and a single gate signal VPADX1.

To control node PAD, pull-down circuit 110 includes a plurality of switching devices 112 and a pull-down driver 114 coupled in series between node PAD and reference node VSSN. Each of switching devices 112 and pull-down driver 114 is configured to provide either a high resistance path or a low resistance path between node PAD and reference node VSSN responsive to control signals VTRACK, VMID1-VMIDN or VMID, and signal NGATE. Each of switching devices 112 and pull-down driver 114 has a maximum operating voltage level substantially equal to or greater than power supply voltage level VDDIO.

In the embodiment depicted in FIG. 1, each switching device 112 is configured to provide the high resistance path in response to a low logical level of a corresponding control signal VTRACK or VMID1-VMIDN and to provide the low resistance path in response to a high logical level of a corresponding control signal VTRACK or VMID1-VMIDN, and pull-down driver 114 is configured to provide the high resistance path in response to a low logical level of signal NGATE and to provide the low resistance path in response to a high logical level of signal NGATE.

In various embodiments, switching device 112 and/or pull-down driver 114 includes at least one of an NMOS transistor, a PMOS transistor, a transmission gate, or another electrical or electromechanical device capable of switching between high and low resistance settings responsive to a received signal.

A first switching device 112 closest to node PAD is configured to receive control signal VTRACK, and pull-down driver 114 is configured to receive signal NGATE. At least one switching device 112 between the first switching device 112 and pull-down driver 114 is configured to receive at least one control signal VMID1-VMIDN.

In the power-on mode, each of control signals VTRACK and VMID1-VMIDN has at least one value based on power supply voltage level VDDIO on node VDDIO1, as discussed below with respect to gate control circuit 130. The values of control signals VTRACK and VMID1-VMIDN in the power-on mode are configured to cause voltages across switching devices 112 to be limited to magnitudes that are less than or substantially equal to the maximum operating voltage level of switching devices 112.

In the power-off mode, each of control signals VTRACK and VMID1-VMIDN has at least one value based on signal VPAD, as discussed below with respect to gate control circuit 130. The values of control signals VTRACK and VMID1-VMIDN in the power-off mode are configured to cause voltages across switching devices 112 to be limited to magnitudes that are less than or substantially equal to the maximum operating voltage level of switching devices 112.

Signal NGATE, received by pull-down driver 114, is generated by a circuit, e.g., signal conditioner 140, external to circuit 100. In the power-on mode, the external circuit generates signal NGATE having power supply voltage level VDDIO when signal VPAD has reference voltage level VSS, and generates signal NGATE having reference voltage level VSS when signal VPAD has bus voltage level VBUS. In the power-off mode, the external circuit generates signal NGATE having reference voltage level VSS.

In the embodiment depicted in FIG. 1, signal conditioner 140 includes an inverter I1 configured to receive an enable signal EN, a NOR gate N1 configured to receive an output of inverter I1 and signal VPAD, and an amplifier A1 configured to output signal NGATE based on the output of NOR gate N1. In operation, signal conditioner 140 is thereby configured to output signal NGATE having either power supply voltage level VDDIO or reference voltage level VSS responsive to signal VPAD when enable signal EN has a high logical level. In various embodiments, signal conditioner 140 is otherwise configured to generate signal NGATE based on signal VPAD.

Pull-down driver 114 is configured to be switched on responsive to signal NGATE having power supply voltage level VDDIO, and to be switched off responsive to signal NGATE having reference voltage level VSS.

In the power-on mode, because gate control circuit 130 is configured to generate control signals VTRACK and VMID1-VMIDN based at least in part on power supply voltage level VDDIO on node VDDIO1, as discussed below, pull-down circuit 110 is thereby configured to couple node PAD with pull-down driver 114 through switching devices 112 using power supply voltage level VDDIO on node VDDIO1, and to further selectively couple node PAD with reference node VSSN through pull-down driver 114 responsive to signal NGATE.

In the power-off mode, because gate control circuit 130 is configured to generate control signals VTRACK and VMID1-VMIDN based on signal VPAD, as discussed below, pull-down circuit 110 is thereby configured to couple node PAD with pull-down driver 114 through switching devices 112 using signal VPAD, and electrically decouple node PAD from reference node VSSN with pull-down driver 114 responsive to signal NGATE having reference voltage level VSS.

By the configuration discussed above, pull-down circuit 110 is capable of both communicating signal VPAD in a power-on mode and preventing leakage current from flowing between node PAD and reference node VSSN in a power-off mode in applications in which bus voltage level VBUS is less than, greater than, or substantially equal to power supply voltage level VDDIO.

In various embodiments, voltage regulator 120 is an electronic circuit configured to receive signal VPAD at node PAD and either output multiple (N>1) gate signals VPADX1-VPADXN based on signal VPAD, e.g., as discussed below with respect to FIG. 3B, or output a single (N=1) gate signal VPADX1, e.g., as discussed below with respect to FIG. 3A.

Voltage regulator 120 is configured to output each gate signal of gate signals VPADX1-VPADXN having voltage levels that are fractions of the voltage levels of signal VPAD. In some embodiments, voltage regulator 120 is configured to output an nth gate signal VPADXn (not labeled) of the N gate signals VPADX1-VPADXN having voltage levels substantially equal to VPAD*(N+1−n)/(N+1). In some embodiments, voltage regulator 120 is configured to output single gate signal VPADX1 having voltage levels substantially equal to VPAD/2.

In the embodiment depicted in FIG. 1, voltage regulator 120 includes a voltage divider 122 configured to divide signal VPAD, thereby generating voltage levels VPADR1-VPADRN corresponding to respective gate signals of gate signals VPADX1-VPADXN. In the embodiment depicted in FIG. 1, voltage regulator 120 includes a buffer circuit 124 configured to output one or more of gate signals VPADX1-VPADXN based on voltage levels voltage levels VPADR1-VPADRN. In some embodiments, voltage regulator 120 is otherwise configured to output gate signals VPADX1-VPADXN having voltage levels that are fractions of the voltage levels of signal VPAD.

Gate control circuit 130 is an electronic circuit configured to receive gate signals VPADX1-VPADXN, and output control signal VTRACK and control signals VMID1-VMIDN based on gate signals VPADX1-VPADXN and the power supply voltage level on node VDDIO1.

Gate control circuit 130 includes control circuits 132 and 134. Each control circuit 132 is configured to receive one of gate signals VPADX1-VPADXN, reference voltage level VSS on node VSSN, and either power supply voltage level VDDIO or reference voltage level VSS on node VDDIO1, and output a corresponding one of control signals VMID1-VMIDN.

Control circuit 134 is configured to receive signal VPAD on node PAD and one of control signals VMID1-VMIDN from a corresponding control circuit 132, and output control signal VTRACK.

In the power-on mode, each control circuit 132 receives power supply voltage level VDDIO on node VDDIO1 and one of gate signals VPADX1-VPADXN, and outputs the higher of power supply voltage level VDDIO or the one of gate signals VPADX1-VPADXN as a corresponding one of control signals VMID1-VMIDN. When signal VPAD has reference voltage level VSS, each control circuit 132 receives one of gate signals VPADX1-VPADXN also having reference voltage level VSS less than power supply voltage level VDDIO, and outputs the corresponding one of control signals VMID1-VMIDN having power supply voltage level VDDIO. When signal VPAD has bus voltage level VBUS, each given control circuit 132 receives one of gate signals VPADX1-VPADXN having a fraction of bus voltage level VBUS, and outputs the corresponding one of control signals VMID1-VMIDN having the corresponding fraction of bus voltage level VBUS if the corresponding fraction is higher than power supply voltage level VDDIO, or having power supply voltage level VDDIO if power supply voltage level VDDIO is higher than or equal to the corresponding fraction.

In the power-off mode, in operation, each control circuit 132 receives reference voltage level VSS on node VDDIO1. When signal VPAD has reference voltage level VSS, each control circuit 132 receives one of gate signals VPADX1-VPADXN also having reference voltage level VSS, and outputs the corresponding one of control signals VMID1-VMIDN having reference voltage level VSS. When signal VPAD has bus voltage level VBUS, each control circuit 132 receives one of gate signals VPADX1-VPADXN having a fraction of bus voltage level VBUS higher than reference voltage level VSS, and outputs the corresponding one of control signals VMID1-VMIDN having the corresponding fraction of bus voltage level VBUS.

Control circuit 134 is configured to receive one of control signals VMID1-VMIDN and signal VPAD, and output control signal VTRACK having a voltage level corresponding to the higher of the two received voltage levels.

In the power-on mode, control circuit 134 receives the one of control signals VMID1-VMIDN having power supply voltage level VDDIO. When signal VPAD has reference voltage level VSS, because power supply voltage level VDDIO is greater than reference voltage level VSS, control circuit 134 outputs control signal VTRACK having power supply voltage level VDDIO. When signal VPAD has bus voltage level VBUS, control circuit 134 outputs control signal VTRACK having the one of power supply voltage level VDDIO or bus voltage level VBUS having the greater voltage level. If power supply voltage level VDDIO is substantially equal to bus voltage level VBUS, control circuit 134 outputs control signal VTRACK having the voltage level corresponding to both power supply voltage level VDDIO and bus voltage level VBUS.

In the power-off mode, control circuit 134 receives the one of control signals VMID1-VMIDN having either the reference voltage level VSS or the voltage level of the corresponding one of gate signals VPADX1-VPADXN. When signal VPAD has reference voltage level VSS substantially equal to the voltage level of the one of control signals VMID1-VMIDN, control circuit 134 outputs control signal VTRACK having reference voltage level VSS. When signal VPAD has bus voltage level VBUS higher than the voltage level of the corresponding one of gate signals VPADX1-VPADXN, control circuit 134 outputs control signal VTRACK having bus voltage level VBUS. Control signal VTRACK thereby has voltage levels that track the voltage levels of signal VPAD in the power-off mode.

Table 1 below provides a non-limiting example of control signals VTRACK and VMID1-VMIDN for an embodiment in which N=2, VBUS>VDDIO, and control circuit 134 is configured to receive control signal VMID1.

TABLE 1

| VDDIO1 | VDDIO (Power-on) | | VSS (Power-off) | |
|---|---|---|---|---|
| VPAD | VSS | VBUS | VSS | VBUS |
| VMID1 | VDDIO | VDDIO/VPADX1 | VSS | VPADX1 |
| VMID2 | VDDIO | VDDIO/VPADX2 | VSS | VPADX2 |
| VTRACK | VDDIO | VBUS | VSS | VBUS |
| NGATE | VDDIO/VSS | VSS | VSS | VSS |

As indicated in the first row of Table 1, node VDDIO1 has either power supply voltage level VDDIO, corresponding to the power-on mode, or reference voltage level VSS, corresponding to the power-off mode. As indicated in the second row of Table 1, signal VPAD has either reference voltage level VSS or bus voltage level VBUS in each of the power-on and power-off modes.

In the power-on mode, when signal VPAD has reference voltage level VSS, voltage regulator 120 outputs each of gate signals VPADX1 and VPADX2 having reference voltage level VSS. Gate control circuit 130 therefore outputs each of control signals VMID1 and VMID 2 having power supply voltage level VDDIO based on power supply voltage level VDDIO being higher than reference voltage level VSS. Because control circuit 134 is configured to receive control signal VMID1 and signal VPAD, gate control circuit 130 outputs control signal VTRACK having power supply voltage level VDDIO based on power supply voltage level VDDIO being higher than reference voltage level VSS.

Because each switching device 112 receives a corresponding control signal having power supply voltage level VDDIO, node PAD is coupled with pull-down driver 114 through a low resistance path. Node PAD is thereby conditionally coupled with reference node VSSN through pull-down driver 114 responsive to signal NGATE and enable signal EN, as discussed above with respect to signal conditioner 140. Because power supply voltage level VDDIO is substantially equal to or less than the maximum operating voltage levels of switching devices 112 and pull-down driver 114, the voltages across each switching device 112 and pull-down driver 114 have magnitudes less than or substantially equal to the corresponding maximum operating voltage levels.

In the power-on mode, when signal VPAD has bus voltage level VBUS, voltage regulator 120 outputs gate signals VPADX1 and VPADX2 having corresponding fractional values of bus voltage level VBUS. Gate control circuit 130 therefore outputs each of control signals VMID1 and VMID 2 having the higher of either power supply voltage level VDDIO or the corresponding fractional value of bus voltage level VBUS. Because bus voltage level VBUS is higher than the fractional value of bus voltage level VBUS provided by gate signal VPADX1, gate control circuit 130 outputs control signal VTRACK having bus voltage level VBUS.

Because signal NGATE has reference voltage level VSS when signal VPAD has bus voltage level VBUS, reference node VSSN is decoupled from switching devices 112 by pull-down driver 114. Voltages across switching devices 112 and pull-down driver 114 therefore have values based on the values of control signals VTRACK, VMID1, and VMID2. By the configuration of voltage regulator 120 and gate control circuit 130, control signals VTRACK, VMID1, and VMID2 have values such that the voltages across each switching device 112 and pull-down driver 114 have magnitudes less than or substantially equal to the corresponding maximum operating voltage levels of switching devices 112 and pull-down driver 114.

In the power-off mode, when signal VPAD has reference voltage level VSS, voltage regulator 120 outputs each of gate signals VPADX1 and VPADX2 having reference voltage level VSS. Because node VDDIO1 also has reference voltage level VSS, gate control circuit 130 outputs each of control signals VTRACK, VMID1 and VMID2 having reference voltage level VSS.

Because each switching device 112 receives a corresponding control signal having reference voltage level VSS, and pull-down driver 144 receives signal NGATE having reference voltage level VSS, voltages across each of switching devices 112 and pull-down driver 114 have magnitudes substantially equal to zero, and thereby less than the corresponding maximum operating voltage levels.

In the power-off mode, when signal VPAD has bus voltage level VBUS, voltage regulator 120 outputs gate signals VPADX1 and VPADX2 having corresponding fractional values of bus voltage level VBUS. Because node VDDIO1 has reference voltage level VSS, gate control circuit 130 outputs each of control signals VMID1 and VMID2 having the corresponding fractional value of bus voltage level VBUS. Because bus voltage level VBUS is higher than the fractional value of bus voltage level VBUS provided by gate signal VPADX1, gate control circuit 130 outputs control signal VTRACK having bus voltage level VBUS.

Because signal NGATE has reference voltage level VSS, reference node VSSN is decoupled from switching devices 112 by pull-down driver 114. Voltages across switching devices 112 and pull-down driver 114 therefore have values based on the values of control signals VTRACK, VMID1, and VMID2. By the configuration of voltage regulator 120 and gate control circuit 130, control signals VTRACK, VMID1, and VMID2 have values such that the voltages across each switching device 112 and pull-down driver 114 have magnitudes less than or substantially equal to the corresponding maximum operating voltage levels of switching devices 112 and pull-down driver 114.

As illustrated by the non-limiting example embodiment of Table 1, circuit 100 is configured as discussed above as an I/O circuit capable of communicating signal VPAD in the power-on mode and as a failsafe circuit capable of preventing leakage current from flowing between node PAD and reference node VSSN in the power-off mode in applications in which bus voltage level VBUS is less than, greater than, or substantially equal to power supply level VDDIO.

By limiting voltages across switching devices 112 and pull-down driver 114 to magnitudes that are less than or substantially equal to corresponding maximum operating voltage levels, circuit 100 is further capable of performing signal communication and leakage prevention operations using switching devices and a pull-down driver having maximum operating voltage levels less than bus voltage level VBUS.

By using switching devices and a pull-down driver having maximum operating voltage levels less than a bus voltage level, circuits, e.g., ICs, that include circuit 100 are capable of being manufactured without including switching devices and/or pull-down drivers having maximum operating voltage levels equal to or greater than a bus voltage level, thereby avoiding the complexity and expense of including such switching devices and/or pull-down drivers.

Figure 2A:
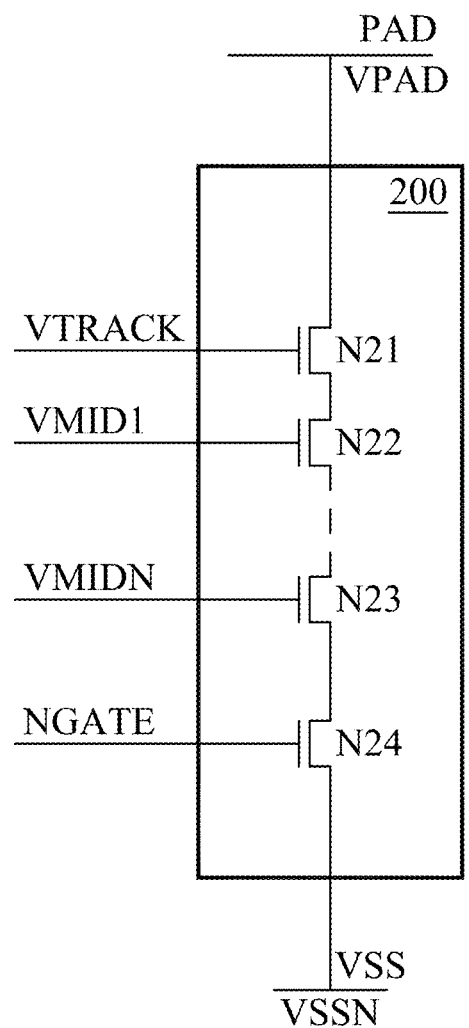
FIG. 2A is a diagram of a pull-down circuit, in accordance with some embodiments.

FIG. 2A is a diagram of a pull-down circuit 200, in accordance with some embodiments. Pull-down circuit 200 is usable as pull-down circuit 110, discussed above with respect to FIG. 1.

Pull-down circuit 200 includes NMOS transistors N21, N22, N23, and N24 coupled in series between node PAD and reference node VSSN. Each of transistors N21, N22, and N23 is usable as a switching device 112, and transistor N24 is usable as a pull-down driver 114, each of which is discussed above with respect to FIG. 1.

In the embodiment depicted in FIG. 2A, pull-down circuit 200 is configured in accordance with N=2, so that a gate of transistor N21 receives control signal VTRACK, a gate of transistor N22 receives control signal VMID1, a gate of transistor N23 receives control signal VMIDN, and a gate of transistor N24 receives signal NGATE, each of which is discussed above with respect to FIG. 1.

In various embodiments, pull-down circuit 200 is configured in accordance with N=1, as discussed above with respect to FIG. 1, in which case pull-down circuit 200 does not include transistor N23, or is configured in accordance with N>2, in which case pull-down circuit 200 includes one or more additional transistors (not shown) between transistors N22 and N23.

As discussed above with respect to FIG. 1, gate control circuit 130 is configured to output control signals VTRACK and VMID1-VMIDN based on both power supply voltage level VDDIO and signal VPAD in the power-on mode, and based solely on signal VPAD in the power-off mode, and output signal NGATE is output based on signal VPAD in the power-on mode and having reference voltage level VSS in the power-off mode.

In the power-on mode, when signal VPAD has bus voltage level VBUS, each of output control signals VTRACK and VMID1-VMIDN has the higher of power supply voltage level VDDIO or a corresponding full or fractional portion of bus voltage level VBUS, and output signal NGATE has reference voltage level VSS. In operation, transistor N24 having a gate voltage at reference voltage level VSS causes transistor N24 to be turned off, thereby decoupling each of transistors N21-N23 and node PAD from reference node VSSN, such that maximum voltages across each of transistors N21-N23 are controlled by control signals VTRACK and VMID1-VMIDN to be at or below power supply voltage level VDDIO.

In the power-on mode, when signal VPAD has reference voltage level VSS, each of output control signals VTRACK and VMID1-VMIDN and output signal NGATE has power supply voltage level VDDIO. In operation, each of transistors N21-N24 having gate voltages at power supply voltage level VDDIO causes each of transistors N21-N24 to be turned on, thereby coupling node PAD to node VSSN such that maximum voltages across each of transistors N21-N24 are at or below power supply voltage level VDDIO.

In the power-off mode, when signal VPAD has bus voltage level VBUS, each of output control signals VTRACK and VMID1-VMIDN has the corresponding full or fractional portion of bus voltage level VBUS, and output signal NGATE has reference voltage level VSS. In operation, transistor N24 having a gate voltage at reference voltage level VSS causes transistor N24 to be turned off, thereby decoupling each of transistors N21-N23 and node PAD from reference node VSSN, such that maximum voltages across each of transistors N21-N23 are controlled by control signals VTRACK and VMID1-VMIDN to be at or below voltage level VDDIO.

In the power-off mode, when signal VPAD has reference voltage level VSS, each of output control signals VTRACK and VMID1-VMIDN and output signal NGATE has reference voltage level VSS. In operation, each of transistors N21-N24 having gate voltages at reference voltage level VSS causes each of transistors N21-N24 to be turned off, thereby decoupling node PAD, having reference voltage level VSS, from node VSSN such that voltages across each of transistors N21-N24 are substantially equal to zero.

Figure 2B:
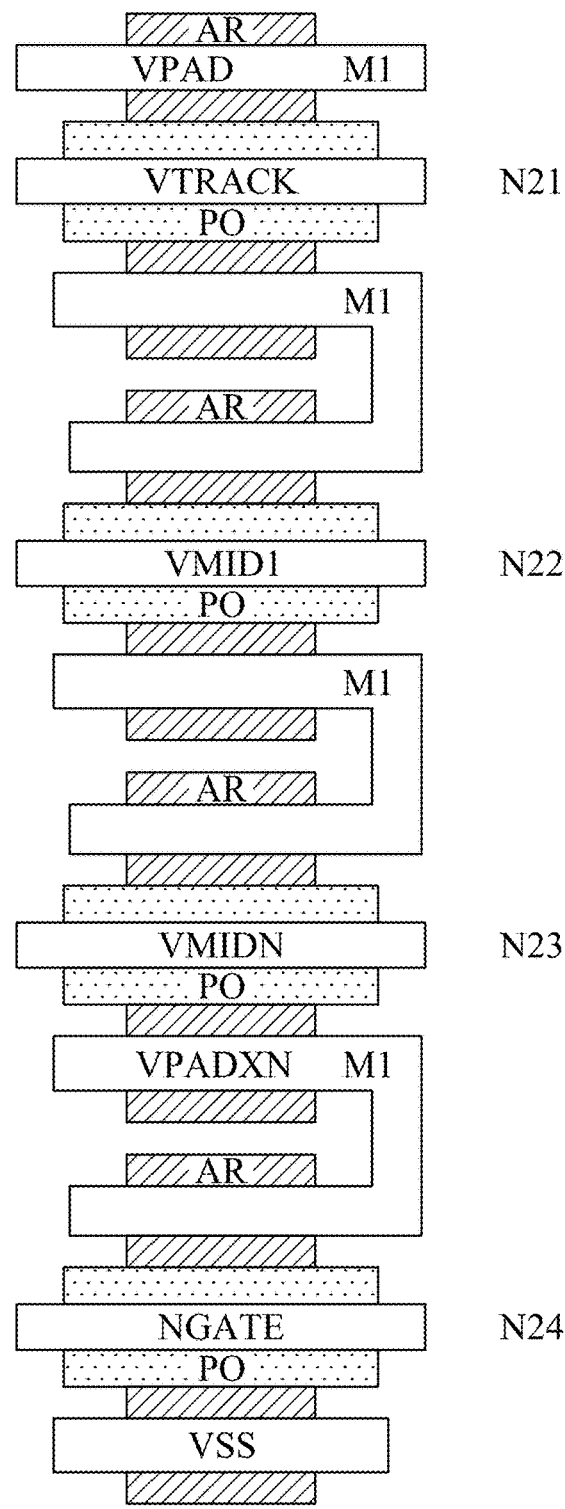
FIG. 2B is a depiction of a top view of an IC layout diagram of a pull-down circuit, in accordance with some embodiments.

FIG. 2B is a depiction of a non-limiting example of a top view of an IC layout diagram of pull-down circuit 200, in accordance with some embodiments. Each of transistors N21, N22, N23, and N24 includes an active region AR, a gate region PO overlying active region AR, and two conductive regions M1 overlying active region AR.

In IC layout diagrams corresponding to circuit 200, as well as to circuits 300, 400A, and 400B discussed below, active region AR, gate region PO, and conductive regions M1 are usable in a manufacturing process, e.g., an IC manufacturing flow as discussed below with respect to manufacturing system 600 and FIG. 6, as part of defining transistors in an IC. A corresponding transistor includes an active area defined in part by active region AR and having source and drain regions.

The corresponding transistor includes a gate structure defined in part by gate region PO and overlying the active area between the source and drain regions, thereby being configured to control a channel between the source and drain regions.

The corresponding transistor also includes conductors, e.g., metal segments, defined in part by the two conductive regions, overlying each of the source and drain regions. The conductors, along with contact structures (not shown) in some embodiments, thereby enable electrical connections to the source and drain regions of the corresponding transistor. In various embodiments, the conductors extend beyond the corresponding transistor, thereby enabling electrical connections to other IC elements, e.g., one or more additional transistors, or the gate structure of the corresponding transistor configured as a diode.

The IC layout diagram embodiment of pull-down circuit 200 depicted in FIG. 2B is simplified for the purpose of clarity. In various embodiments, an IC layout diagram of pull-down circuit 200 includes features in addition to those depicted in FIG. 2B, e.g., one or more transistor elements, power rails, isolation structures, gate structures, dummy gate structures, wells, vias, conductive elements, or the like.

Transistor N21 includes a conductive region M1 configured to couple signal VPAD with the corresponding active region AR, and a gate region PO configured to receive control signal VTRACK; transistor N22 includes a gate region PO configured to receive control signal VMID1; transistor N23 includes a gate region PO configured to receive control signal VMIDN; and transistor N24 includes a gate region PO configured to receive signal NGATE and a conductive region M1 configured to couple reference voltage level VSS with the corresponding active region AR.

A conductive region M1 is configured to electrically connect the active region AR of transistor N21 to the active region AR of transistor N22; a conductive region M1 is configured to electrically connect the active region AR of transistor N22 to the active region AR of transistor N23; and a conductive region M1 is configured to electrically connect the active region AR of transistor N23 to the active region AR of transistor N23.

In some embodiments, the IC layout diagram embodiment of pull-down circuit 200 is included in an IC design layout diagram 622 generated as part of a design procedure performed in a design house, e.g., a design house 620, discussed below with respect to FIG. 6. In some embodiments, an IC device, e.g., an IC device 660, is manufactured based on the IC layout diagram of pull-down circuit 200 in accordance with an IC manufacturing flow as discussed below with respect to manufacturing system 600 and FIG. 6.

By the configuration and non-limiting example layout discussed above, pull-down circuit 200 is capable of enabling the benefits discussed above with respect to pull-down circuit 110 of circuit 100.

Figure 3A:
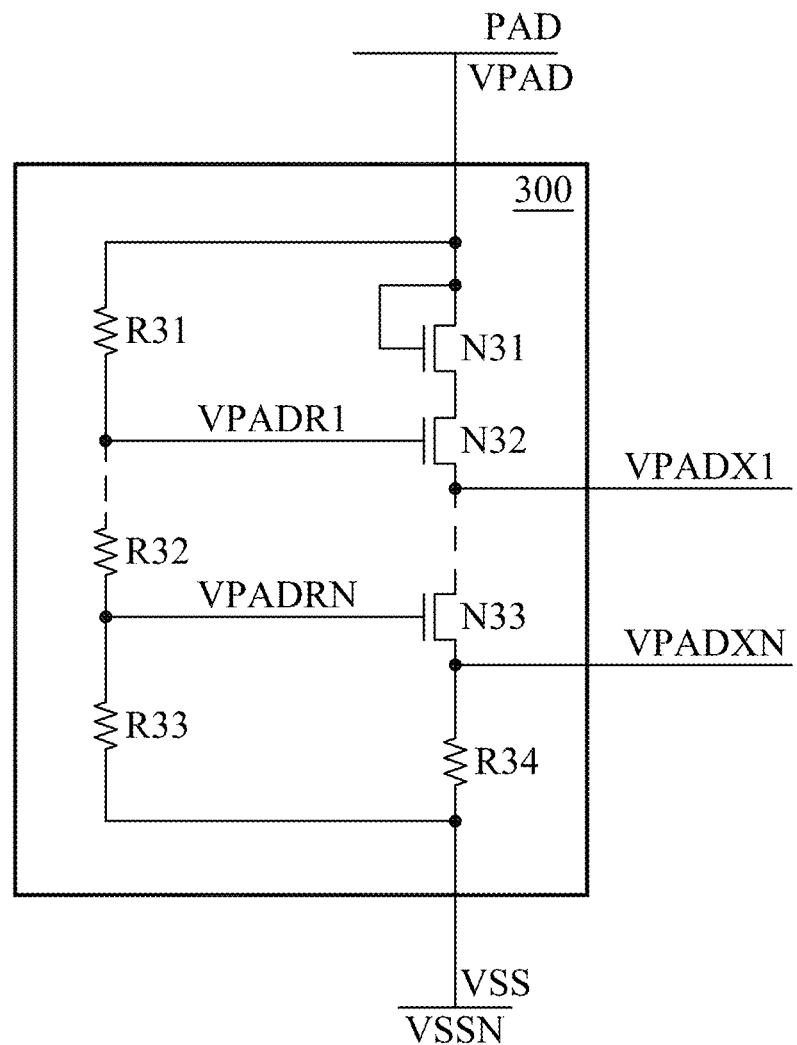
FIG. 3A is a diagram of a voltage regulator, in accordance with some embodiments.

FIG. 3A is a diagram of a voltage regulator 300, in accordance with some embodiments. Voltage regulator 300 is usable as voltage regulator 120, discussed above with respect to FIG. 1.

Voltage regulator 300 includes resistors R31, R32, and R33 coupled in series between node PAD and reference node VSSN, and NMOS transistors N31 and N32 and resistor R34 coupled in series between node PAD and reference node VSSN. Resistors R31, R32, and R33 are usable as voltage divider 122, and transistors N31, N32, and N33 and resistor R34 are usable as buffer circuit 124, each of which is discussed above with respect to FIG. 1.

By the configuration depicted in FIG. 3A, resistors R31, R32, and R33, in operation, divide signal VPAD on node PAD, thereby generating voltage levels VPADR1-VPADRN, as discussed above with respect to FIG. 1. In various embodiments, each of R31, R32, and R33 has a same resistance value, or at least one of resistors R31, R32, or R33 has one or more resistance values different from a resistance value of one or more other ones of resistors R31, R32, or R33.

Transistors N32 and N33 are configured as source followers that, in operation, receive voltage levels VPADR1 and VPADRN at respective gates and output the voltage levels at respective source terminals as respective gate signals VPADX1 and VPADXN. Transistor N31 is configured as a diode having a gate electrically connected to a drain terminal. In operation, transistor N31 and resistor R34 regulate current through transistors N32 and N33.

In the embodiment depicted in FIG. 3A, voltage regulator 300 is configured in accordance with N=2 and R31=R32=R33, so that resistors R31, R32, and R33 divide signal VPAD into thirds, thereby generating voltage level VPADR1 and gate signal VPADX1 substantially equal to VPAD*⅔, and voltage level VPADR2 and gate signal VPADXN substantially equal to VPAD*⅓.

In some embodiments, voltage regulator 300 is configured in accordance with N=1, as discussed above with respect to FIG. 1, in which case voltage regulator 300 does not include resistor R32 or transistor N33, and generates a single gate signal VPADX1 having voltage level VPADR1. In some embodiments, voltage regulator 300 is configured in accordance with N>2, in which case voltage regulator 300 includes one or more additional resistors (not shown) between resistors R31 and R32, and one or more additional transistors (not shown) between transistors N32 and N33.

The number and relative values of the resistors, e.g., resistors R31-R33, coupled in series between node PAD and reference node VSSN are based on the expected value of signal VPAD on node PAD having bus voltage level VBUS. The resistors have a number and relative values such that, in operation, when signal VPAD has bus voltage level VBUS, each of voltage levels VPADR1-VPADRN is sufficiently large to turn on a corresponding transistor N32, N33, etc.

In operation, transistors N32, N33, etc. being turned on causes current to flow through transistors N32, N33, etc., diode-configured transistor N31, and resistor R34, thereby enabling each of transistors N32, N33, etc. to be turned on and operate as a source follower.

In the embodiment depicted in FIG. 3A, three resistors R31-R33 having substantially equal values operate to generate voltage level VPADRN from bus voltage level VBUS sufficiently large to turn on transistor N33, and to generate voltage level VPADR1 from bus voltage level VBUS sufficiently large to turn on transistor N32, thereby enabling transistor N33 to operate as a source follower to generate gate signal VPADXN and transistor N32 to operate as a source follower to generate gate signal VPADX1.

In various embodiments, voltage regulator 300 includes numbers of resistors having relative values other than three resistors having substantially equal values such that voltage levels VPADR1-VPADRN generated from bus voltage level VBUS are sufficiently large to turn on corresponding transistors N32, N33, etc., thereby enabling transistors N32, N33, etc. to operate as source followers to generate gate signals VPADX1-VPADXN.

In operation, when signal VPAD has reference voltage level VSS, each of voltage levels VPADR1-VPADRN also has reference voltage level VSS, each of transistors N32, N33, etc. is turned off, and each of gate signals VPADX1-VPADXN has reference voltage level VSS.

By the configuration discussed above, voltage regulator 300 operates to dynamically generate gate signals VPADX1-VPADXN responsive to signal VPAD on node PAD, as discussed above with respect to FIG. 1.

Figure 3B:
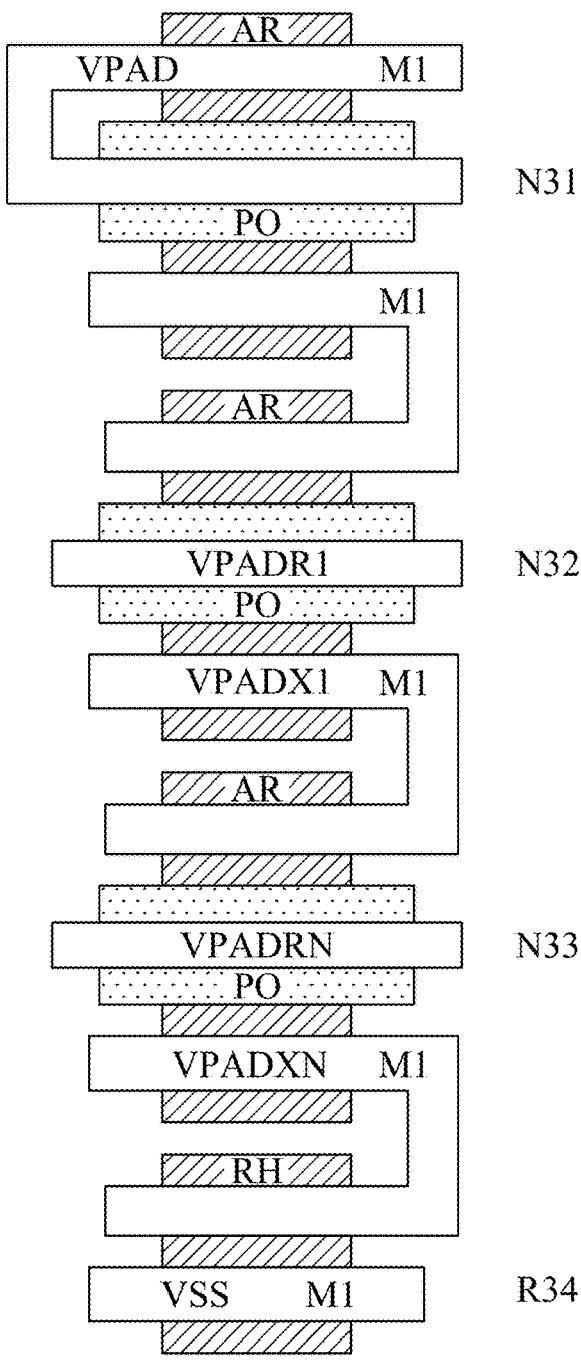
FIG. 3B is a depiction of a top view of an IC layout diagram of a voltage regulator, in accordance with some embodiments.

FIG. 3B is a depiction of a non-limiting example of a top view of an IC layout diagram of a portion of voltage regulator 300, in accordance with some embodiments. FIG. 3B depicts each of transistors N31, N32, and N33 including an active region AR, a gate region PO overlying active region AR, and two conductive regions M1 overlying active region AR. FIG. 3B also depicts resistor R34 including a resistive region RH.

The IC layout diagram embodiment of the portion of voltage regulator 300 depicted in FIG. 3B is simplified for the purpose of clarity. In various embodiments, an IC layout diagram of the portion of voltage regulator 300 includes features in addition to those depicted in FIG. 3B, e.g., one or more transistor elements, power rails, isolation structures, gate structures, dummy gate structures, wells, vias, conductive elements, or the like.

Transistor N31 includes a conductive region M1 configured to couple signal VPAD with the corresponding active region AR and gate region PO; transistor N32 includes a gate region PO configured to receive voltage level VPADR1; transistor N33 includes a gate region PO configured to receive voltage level VPADRN; and resistor R34 includes resistive region RH.

A conductive region M1 is configured to electrically connect the active region AR of transistor N32 to the active region AR of transistor N33, and to output gate signal VPADX1; a conductive region M1 is configured to electrically connect the active region AR of transistor N33 to resistive region RH, and to output gate signal VPADXN; and a conductive region M1 is configured to couple reference voltage level VSS with resistive region RH.

In some embodiments, the IC layout diagram embodiment of the portion of voltage regulator 300 is included in an IC design layout diagram 622 generated as part of a design procedure performed in a design house, e.g., a design house 620, discussed below with respect to FIG. 6. In some embodiments, an IC device, e.g., an IC device 660, is manufactured based on the portion of voltage regulator 300 in accordance with an IC manufacturing flow as discussed below with respect to manufacturing system 600 and FIG. 6.

By the configuration and non-limiting example layout discussed above, voltage regulator 300 is capable of enabling the benefits discussed above with respect to voltage regulator 120 of circuit 100.

Figure 4A:
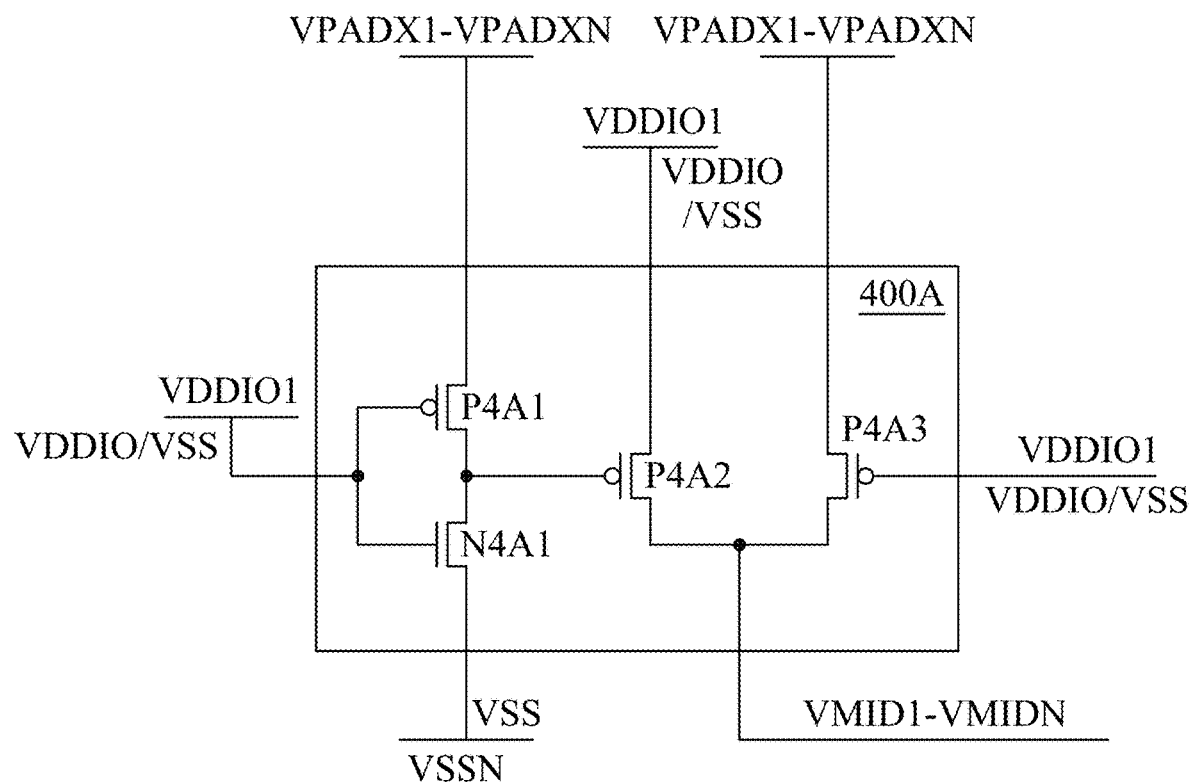
FIG. 4A is a diagram of a gate control circuit, in accordance with some embodiments.

FIG. 4A is a diagram of a control circuit 400A, in accordance with some embodiments. Control circuit 400A is usable as control circuit 132, discussed above with respect to FIG. 1.

Control circuit 400A includes PMOS transistors P4A1, P4A2, and P4A3, and an NMOS transistor N4A1. The gates of transistors P4A1 and N4A1 are electrically connected to each other and configured to receive the power supply voltage on node VDDIO1, a source terminal of transistor N4A1 is configured to receive reference voltage level VSS, and a source terminal of transistor P4A1 is configured to receive one of gate signals VPADX1-VPADXN.

Source terminals of transistors P4A1 and N4A1 are electrically connected to each other and to a gate of transistor P4A2, and a source terminal of transistor P4A2 is configured to receive the power supply voltage on node VDDIO1.

A gate of transistor P4A3 is configured to receive the power supply voltage on node VDDIO1, and a source terminal of transistor P4A3 is configured to receive the same one of gate signals VPADX1-VPADXN that is received at the source terminal of transistor P4A1.

Drain terminals of transistors P4A2 and P4A3 are electrically connected to each other and configured to output one of control signals VMID1-VMIDX corresponding to the one of gate signals VPADX1-VPADXN received at the source terminals of transistors P4A1 and P4A3.

In the power-on mode, when node VDDIO1 has power supply voltage level VDDIO, and the one of gate signals VPADX1-VPADXN has a value less than power supply voltage level VDDIO plus a threshold voltage level of transistors P4A1 and P4A3, each of transistors P4A1 and P4A3 is turned off and transistor N4A1 is turned on, causing reference voltage level VSS to be provided to the gate of transistor P4A2. Thus, transistor P4A2 is turned on and power supply voltage level VDDIO is output as the corresponding control signal VMID1-VMIDN.

When the one of gate signals VPADX1-VPADXN has a value greater than or substantially equal to power supply voltage level VDDIO plus the threshold voltage level of transistors P4A1 and P4A3, each of transistors P4A1, P4A3, and N4A1 is turned on, causing power supply voltage level VDDIO to be provided to the gate of transistor P4A2. Thus, transistor P4A2 is turned off and the one of gate signals VPADX1-VPADXN is output as the corresponding control signal VMID1-VMIDN.

In the power-off mode, when node VDDIO1 has reference voltage level VSS and the one of gate signals VPADX1-VPADXN has a value greater than reference voltage level VSS, each of transistors P4A1 and P4A3 is turned on, each of transistors N4A1 and P4A2 is turned off, and the one of gate signals VPADX1-VPADXN is output as the corresponding control signal VMID1-VMIDN.

In the power-off mode, when each of node VDDIO1 and the one of gate signals VPADX1-VPADXN has reference voltage level VSS, the corresponding control signal VMID1-VMIDN is output having reference voltage level VSS. By the configuration discussed above, control circuit 400A, in operation, outputs a given one of control signals VMID1-VMIDN based on the corresponding one of gate signals VPADX1-VPADXN, reference voltage level VSS, and the power supply voltage on node VDDIO1 having values as discussed above with respect to control circuit 132 and FIG. 1.

Figure 4B:
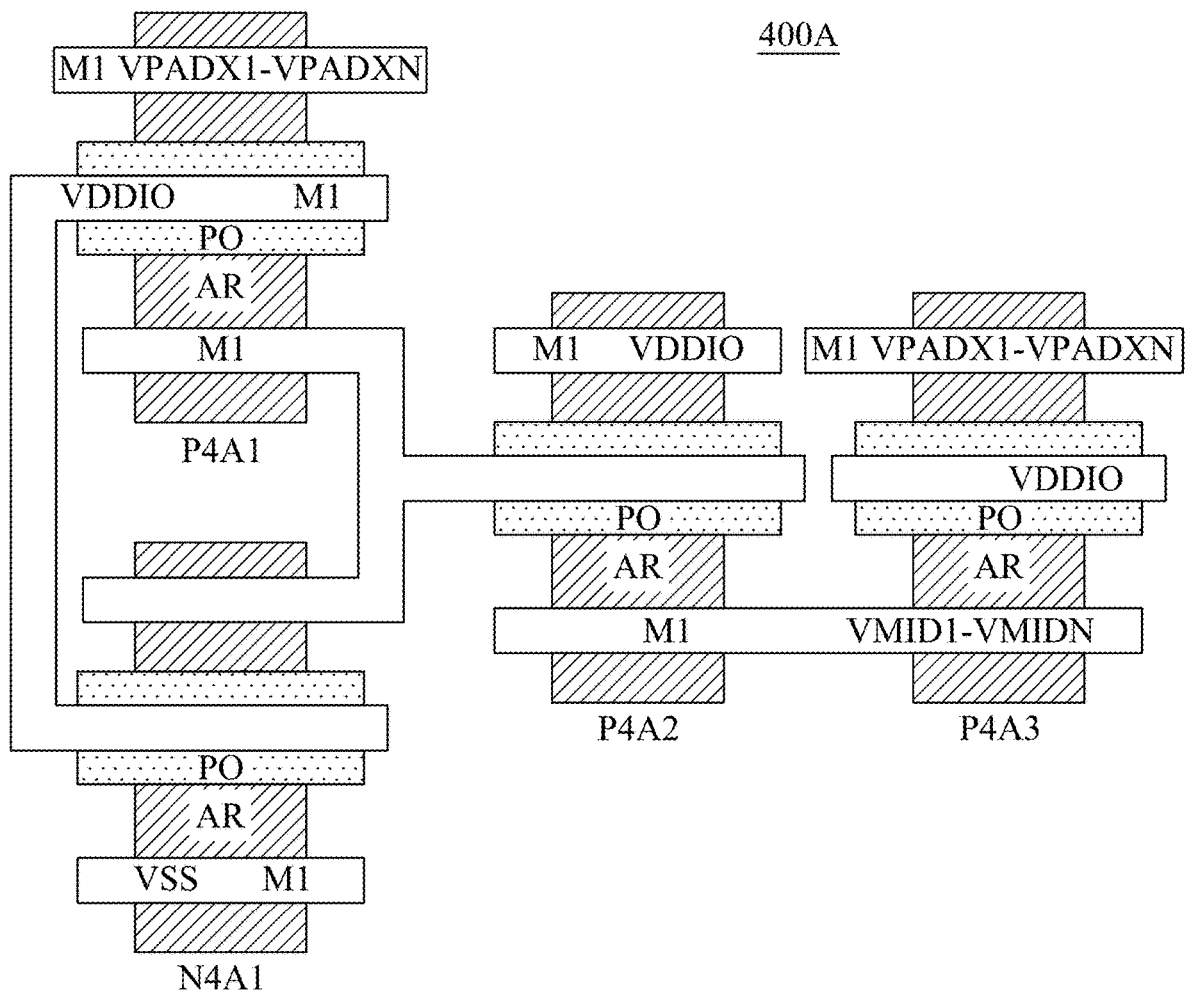
FIG. 4B is a depiction of a top view of an IC layout diagram of a gate control circuit, in accordance with some embodiments.

FIG. 4B is a depiction of a non-limiting example of a top view of an IC layout diagram of control circuit 400A, in accordance with some embodiments. FIG. 4B depicts each of transistors P4A1, N4A1, P4A2, and P4A3 including an active region AR, a gate region PO overlying active region AR, and two conductive regions M1 overlying active region AR.

The IC layout diagram embodiment of control circuit 400A depicted in FIG. 4B is simplified for the purpose of clarity. In various embodiments, an IC layout diagram of control circuit 400A includes features in addition to those depicted in FIG. 4B, e.g., one or more transistor elements, power rails, isolation structures, gate structures, dummy gate structures, wells, vias, conductive elements, or the like.

Transistor P4A1 includes a conductive region M1 configured to couple a signal, e.g., gate signal VPADX1, with the corresponding active region AR, and a gate region PO configured to receive the power supply voltage on node VDDIO1; transistor N4A1 includes a gate region PO configured to receive the power supply voltage on node VDDIO1, and a conductive region M1 configured to receive reference voltage VSS; transistor P4A2 includes a conductive region M1 configured to receive the power supply voltage on node VDDIO1; and transistor P4A3 includes a gate region PO configured to receive the power supply voltage on node VDDIO1 and a conductive region M1 configured to couple the signal with the corresponding active region AR.

A conductive region M1 is configured to electrically connect the gate region PO of transistor P4A1 to the gate region PO of transistor N4A1; a conductive region M1 is configured to electrically connect the active regions AR of transistors P4A1 and N4A1 to the gate region PO of transistor P4A2; and a conductive region M1 is configured to electrically connect the active regions AR of transistors P4A2 and P4A3 to each other, and to output a control signal, e.g., control signal VMID1.

In some embodiments, the IC layout diagram embodiment of control circuit 400A is included in an IC design layout diagram 622 generated as part of a design procedure performed in a design house, e.g., a design house 620, discussed below with respect to FIG. 6. In some embodiments, an IC device, e.g., an IC device 660, is manufactured based on control circuit 400A in accordance with an IC manufacturing flow as discussed below with respect to manufacturing system 600 and FIG. 6.

By the configuration and non-limiting example layout discussed above, control circuit 400A is capable of enabling the benefits discussed above with respect to control circuit 132 of circuit 100.

Figure 4C:
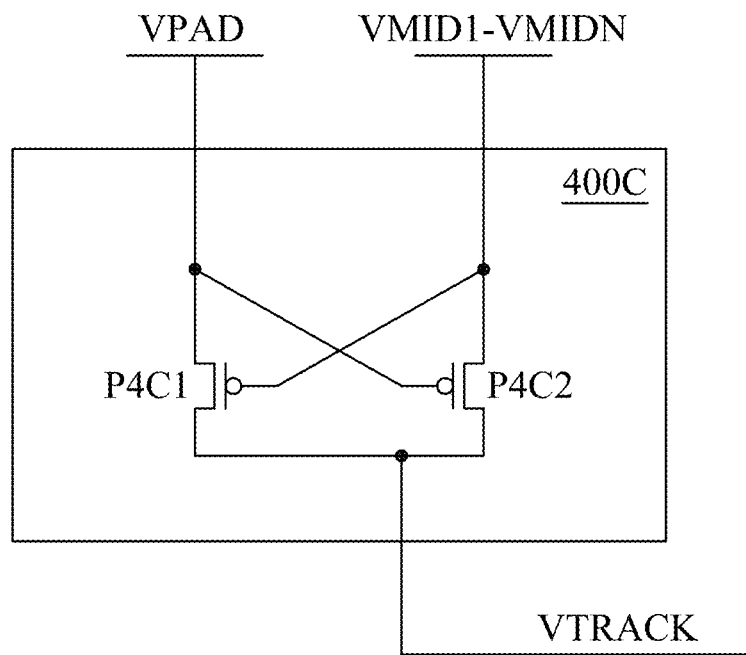
FIG. 4C is a diagram of a gate control circuit, in accordance with some embodiments.

FIG. 4C is a diagram of a control circuit 400C, in accordance with some embodiments. Control circuit 400C is usable as control circuit 134, discussed above with respect to FIG. 1.

Control circuit 400C includes latched PMOS transistors P4C1 and P4C2. A gate of transistor P4C1 is electrically connected to a source of transistor P4C2 and configured to receive one of control signals VMID1-VMIDN. A gate of transistor P4C2 is electrically connected to a source of transistor P4C1 and configured to receive signal VPAD on node PAD. Drain terminals of transistors P4C1 and P4C2 are electrically connected to each other and configured to output control signal VTRACK.

In operation, when signal VPAD has a voltage level equal to or higher than a voltage level of the corresponding one of control signals VMID1-VMIDN plus the threshold voltage of transistor P4C1, transistor P4C1 is turned on and transistor P4C2 is turned off, thereby causing the voltage level of signal VPAD to be output as control signal VTRACK. When the corresponding one of control signals VMID1-VMIDN has a voltage level equal to or higher than a voltage level of signal VPAD plus the threshold voltage of transistor P4C2, transistor P4C2 is turned on and transistor P4C1 is turned off, thereby causing the voltage level of the corresponding one of control signals VMID1-VMIDN to be output as control signal VTRACK.

When signal VPAD and the corresponding one of control signals VMID1-VMIDN have voltage levels that differ by an amount less than the threshold voltages of transistors P4C1 and P4C2, the one of transistors P4C1 or P4C2 having the higher source terminal voltage level is more conductive than the other of transistors P4C1 or P4C2, thereby causing the higher of the two voltage levels to be output as control signal VTRACK.

In the power-on mode, each of control signals VMID1-VMIDN has a voltage level at least as high as power supply voltage level VDDIO, as discussed above with respect to control circuits 132 and 400A and FIGS. 1 and 4A. When signal VPAD has bus voltage level VBUS and the corresponding one of control signals VMID1-VMIDN has power supply voltage level VDDIO, control circuit 400C outputs control signal VTRACK having the higher of bus voltage level VBUS or power supply voltage level VDDIO. When signal VPAD has bus voltage level VBUS and the corresponding one of control signals VMID1-VMIDN has a value corresponding to a fractional portion of bus voltage level VBUS, bus voltage level VBUS is higher than the fractional portion of bus voltage level VBUS, and control circuit 400C outputs control signal VTRACK having bus voltage level VBUS.

In the power-on mode, when signal VPAD has reference voltage level VSS, the corresponding one of control signals VMID1-VMIDN has power supply voltage level VDDIO higher than reference voltage level VSS, and control circuit 400C outputs control signal VTRACK having power supply voltage level VDDIO.

In the power-off mode, the corresponding one of control signals VMID1-VMIDN has a value corresponding to either a fractional portion of bus voltage level VBUS when signal VPAD has bus voltage level VBUS, or reference voltage level VSS when signal VPAD has reference voltage level VSS. Thus, control circuit 400C outputs control signal VTRACK having bus voltage level VBUS when signal VPAD has bus voltage level VBUS, and outputs control signal VTRACK having reference voltage level VSS when signal VPAD has reference voltage level VSS.

By the configuration discussed above, control circuit 400C, in operation, outputs control signal VTRACK based on the corresponding one of control signals VMID1-VMIDN and control signal VPAD having values as discussed above with respect to control circuit 134 and FIG. 1.

Figure 4D:
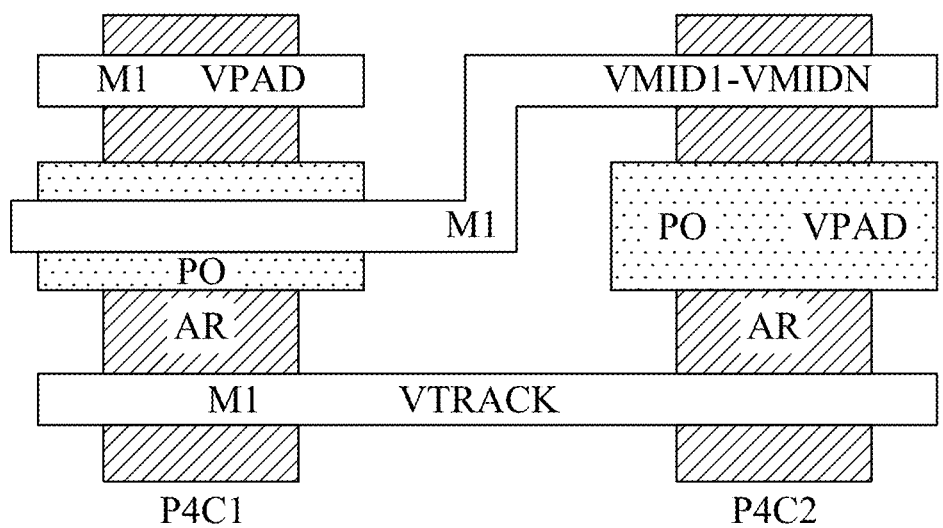
FIG. 4D is a depiction of a top view of an IC layout diagram of a gate control circuit, in accordance with some embodiments.

FIG. 4D is a depiction of a non-limiting example of a top view of an IC layout diagram of control circuit 400C, in accordance with some embodiments. FIG. 4D depicts each of transistors P4C1 and P4C2 including an active region AR, a gate region PO overlying active region AR, and two conductive regions M1 overlying active region AR.

The IC layout diagram embodiment of control circuit 400C depicted in FIG. 4D is simplified for the purpose of clarity. In various embodiments, an IC layout diagram of control circuit 400C includes features in addition to those depicted in FIG. 4D, e.g., one or more transistor elements, power rails, isolation structures, gate structures, dummy gate structures, wells, vias, conductive elements, or the like.

Transistor P4C1 includes a conductive region M1 configured to couple signal VPAD with the corresponding active region AR, and a gate region PO configured to receive one of control signals VMID1-VMIDN; and transistor P4C2 includes a gate region PO configured to receive signal VPAD.

A conductive region M1 is configured to electrically connect the gate region PO of transistor P4C1 to the active region AR of transistor P4C2 and to receive the one of control signals VMID1-VMIDN; and a conductive region M1 is configured to electrically connect the active regions AR of transistors P4C1 and P4C2 to each other, and to output control signal VTRACK.

In some embodiments, the IC layout diagram embodiment of control circuit 400C is included in an IC design layout diagram 622 generated as part of a design procedure performed in a design house, e.g., a design house 620, discussed below with respect to FIG. 6. In some embodiments, an IC device, e.g., an IC device 660, is manufactured based on control circuit 400C in accordance with an IC manufacturing flow as discussed below with respect to manufacturing system 600 and FIG. 6.

By the configuration and non-limiting example layout discussed above, control circuit 400C is capable of enabling the benefits discussed above with respect to control circuit 134 of circuit 100.

Figure 5:
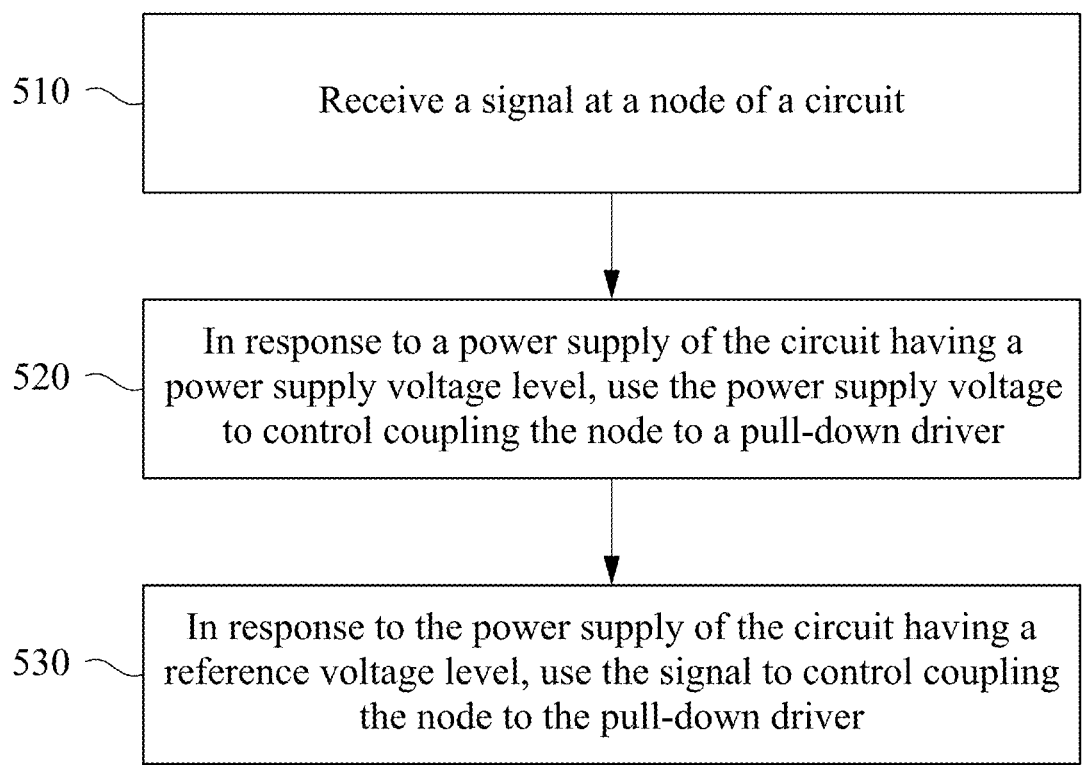
FIG. 5 is a flowchart of a method of controlling a node of a circuit, in accordance with some embodiments.

FIG. 5 is a flowchart of a method 500 of controlling a node of a circuit, in accordance with one or more embodiments. Method 500 is usable with a circuit, e.g., circuit 100 discussed above with respect to FIG. 1.

The sequence in which the operations of method 500 are depicted in FIG. 5 is for illustration only; the operations of method 500 are capable of being executed in sequences that differ from that depicted in FIG. 5. In some embodiments, operations in addition to those depicted in FIG. 5 are performed before, between, during, and/or after the operations depicted in FIG. 5. In some embodiments, the operations of method 500 are a subset of operations of a method of operating an I/O circuit.

At operation 510, a signal is received at a node of the circuit. In some embodiments, the circuit is included in an IC chip and receiving the signal includes receiving the signal over a bus from a source outside of the IC chip, e.g., another IC chip. In some embodiments, receiving the signal includes receiving a signal conforming to an IIC standard.

In some embodiments, receiving the signal includes receiving signal VPAD at node PAD of circuits 100, 200, 300, and 400C, discussed above with respect to FIGS. 1-3B, 4C, and 4D.

Receiving the signal includes receiving the signal having either a logically high voltage level or a logically low voltage level. In various embodiments, the logically high voltage level is less than, substantially equal to, or greater than a power supply voltage level of a power supply voltage used to power the circuit, and receiving the signal includes receiving the signal having a voltage level less than, substantially equal to, or greater than the power supply voltage level.

At operation 520, in response to a power supply of the circuit having a power supply voltage level, the power supply voltage is used to control coupling the node to a pull-down driver. The power supply having the power supply voltage level corresponds to a power-on mode.

In some embodiments, using the power supply voltage to control coupling the node to the pull-down driver includes controlling a plurality of transistors with a plurality of control signals. In some embodiments, controlling the plurality of transistors with the plurality of control signals includes generating the plurality of control signals based at least in part on the power supply voltage.

In some embodiments, controlling the plurality of transistors with the plurality of control signals based at least in part on the power supply voltage includes controlling pull-down circuits 110 or 200 with control signals VTRACK and VMID1-VMIDN generated by control circuits 130, 400A, or 400C, discussed above with respect to FIGS. 1-2B and 4A-4C.

In some embodiments, controlling the plurality of transistors with the plurality of control signals based at least in part on the power supply voltage includes controlling voltages across each transistor of the plurality of transistors to be less than or substantially equal to a maximum operating voltage of the plurality of transistors.

At operation 530, in response to the power supply of the circuit having a reference voltage level, the signal is used to control coupling the node to the pull-down driver. The power supply having the reference voltage level corresponds to a power-off mode.

In some embodiments, using the signal to control coupling the node to the pull-down driver includes controlling a plurality of transistors with a plurality of control signals. In some embodiments, controlling the plurality of transistors with the plurality of control signals includes generating the plurality of control signals based at least in part on the signal.

In some embodiments, controlling the plurality of transistors with the plurality of control signals based at least in part on the signal includes controlling pull-down circuits 110 or 200 with control signals VTRACK and VMID1-VMIDN generated by control circuits 130, 400A, or 400C, discussed above with respect to FIGS. 1-2B and 4A-4C.

In some embodiments, controlling the plurality of transistors with the plurality of control signals based at least in part on the signal includes controlling voltages across each transistor of the plurality of transistors to be less than or substantially equal to a maximum operating voltage of the plurality of transistors.

By executing the operations of method 500, a node is controlled using a power supply voltage in a power-on mode, and using a signal in a power-off mode, thereby obtaining the benefits discussed above with respect to circuit 100 and FIG. 1.

Figure 6:
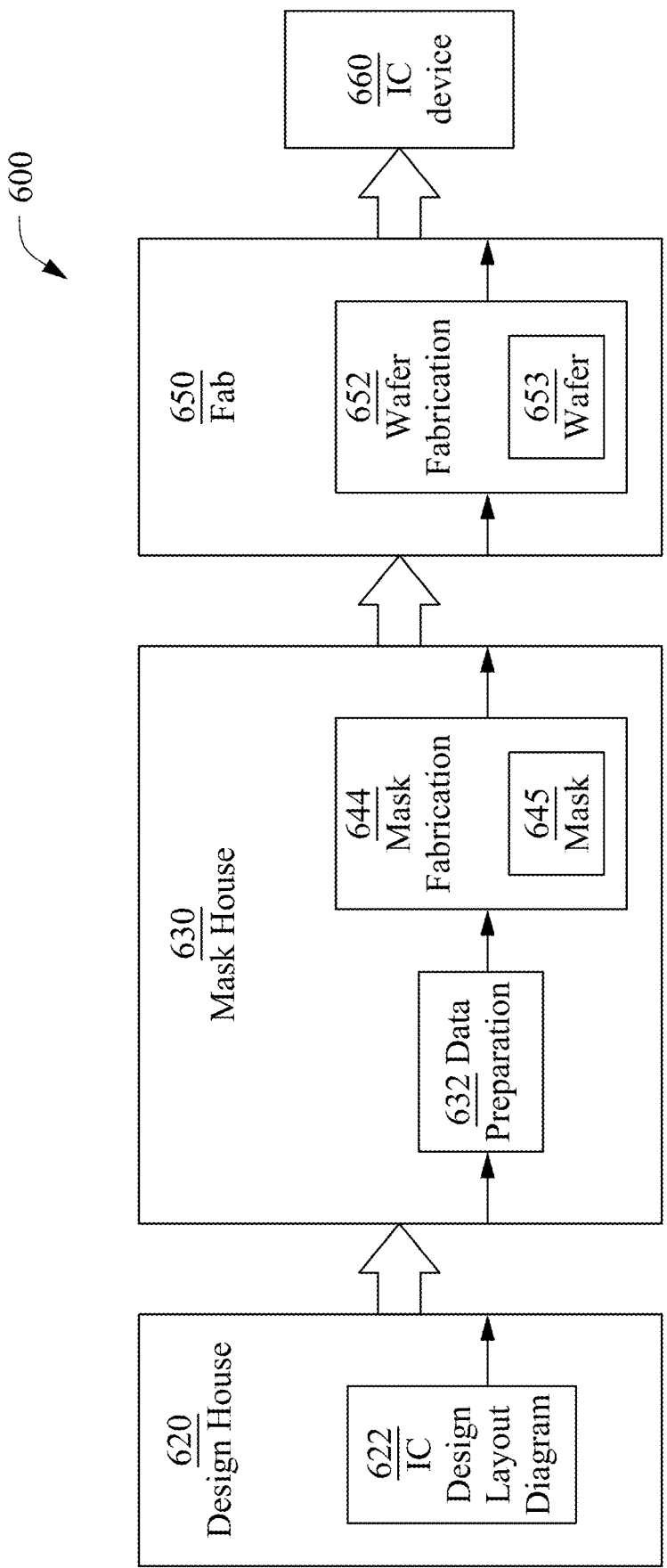
FIG. 6 is a depiction of an IC manufacturing system and an IC manufacturing flow associated therewith, in accordance with some embodiments.

FIG. 6 is a block diagram of an integrated circuit (IC) manufacturing system 600, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 600.

In FIG. 6, IC manufacturing system 600 includes entities, such as a design house 620, a mask house 630, and an IC manufacturer/fabricator ("fab") 650, that interact with one another in the design, development, and manufacturing cycles and/or services related to manufacturing an IC device 660. The entities in system 600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 620, mask house 630, and IC fab 650 is owned by a single larger company. In some embodiments, two or more of design house 620, mask house 630, and IC fab 650 coexist in a common facility and use common resources.

Design house (or design team) 620 generates IC design layout diagram 622. IC design layout diagram 622 includes various geometrical patterns designed for IC device 660. The geometrical patterns correspond to patterns of metal, oxide, or semiconductor layers that make up the various components of IC device 660 to be fabricated. The various layers combine to form various IC features. For example, a portion of IC design layout diagram 622 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 620 implements a proper design procedure to form IC design layout diagram 622. The design procedure includes one or more of logic design, physical design or place and route. IC design layout diagram 622 is presented in one or more data files having information of the geometrical patterns. For example, IC design layout diagram 622 can be expressed in a GDSII file format or DFII file format.

Mask house 630 includes data preparation 632 and mask fabrication 644. Mask house 630 uses IC design layout diagram 622 to manufacture one or more masks 645 to be used for fabricating the various layers of IC device 660 according to IC design layout diagram 622. Mask house 630 performs mask data preparation 632, where IC design layout diagram 622 is translated into a representative data file ("RDF"). Mask data preparation 632 provides the RDF to mask fabrication 644. Mask fabrication 644 includes a mask writer. A mask writer converts the RDF to an image on a substrate, such as a mask (reticle) 645 or a semiconductor wafer 653. The design layout diagram 622 is manipulated by mask data preparation 632 to comply with particular characteristics of the mask writer and/or requirements of IC fab 650. In FIG. 6, mask data preparation 632 and mask fabrication 644 are illustrated as separate elements. In some embodiments, mask data preparation 632 and mask fabrication 644 can be collectively referred to as mask data preparation.

In some embodiments, mask data preparation 632 includes optical proximity correction (OPC) which uses lithography enhancement techniques to compensate for image errors, such as those that can arise from diffraction, interference, other process effects and the like. OPC adjusts IC design layout diagram 622. In some embodiments, mask data preparation 632 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 632 includes a mask rule checker (MRC) that checks the IC design layout diagram 622 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 622 to compensate for limitations during mask fabrication 644, which may undo part of the modifications performed by OPC in order to meet mask creation rules.

In some embodiments, mask data preparation 632 includes lithography process checking (LPC) that simulates processing that will be implemented by IC fab 650 to fabricate IC device 760. LPC simulates this processing based on IC design layout diagram 622 to create a simulated manufactured device, such as IC device 660. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 622.

It should be understood that the above description of mask data preparation 632 has been simplified for the purposes of clarity. In some embodiments, data preparation 632 includes additional features such as a logic operation (LOP) to modify the IC design layout diagram 622 according to manufacturing rules. Additionally, the processes applied to IC design layout diagram 622 during data preparation 632 may be executed in a variety of different orders.

After mask data preparation 632 and during mask fabrication 644, a mask 645 or a group of masks 645 are fabricated based on the modified IC design layout diagram 622. In some embodiments, mask fabrication 644 includes performing one or more lithographic exposures based on IC design layout diagram 622. In some embodiments, an electron-beam (e-beam) or a mechanism of multiple e-beams is used to form a pattern on a mask (photomask or reticle) 645 based on the modified IC design layout diagram 622. Mask 645 can be formed in various technologies. In some embodiments, mask 645 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 645 includes a transparent substrate (e.g., fused quartz) and an opaque material (e.g., chromium) coated in the opaque regions of the binary mask. In another example, mask 645 is formed using a phase shift technology. In a phase shift mask (PSM) version of mask 645, various features in the pattern formed on the phase shift mask are configured to have proper phase difference to enhance the resolution and imaging quality. In various examples, the phase shift mask can be attenuated PSM or alternating PSM. The mask(s) generated by mask fabrication 644 is used in a variety of processes. For example, such a mask(s) is used in an ion implantation process to form various doped regions in semiconductor wafer 653, in an etching process to form various etching regions in semiconductor wafer 653, and/or in other suitable processes.

IC fab 650 includes wafer fabrication 652. IC fab 650 is an IC fabrication business that includes one or more manufacturing facilities for the fabrication of a variety of different IC products. In some embodiments, IC Fab 650 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 650 uses mask(s) 645 fabricated by mask house 630 to fabricate IC device 660. Thus, IC fab 650 at least indirectly uses IC design layout diagram 622 to fabricate IC device 660. In some embodiments, semiconductor wafer 653 is fabricated by IC fab 650 using mask(s) 645 to form IC device 660. In some embodiments, the IC fabrication includes performing one or more lithographic exposures based at least indirectly on IC design layout diagram 622. Semiconductor wafer 653 includes a silicon substrate or other proper substrate having material layers formed thereon. Semiconductor wafer 653 further includes one or more of various doped regions, dielectric features, multilevel interconnects, and the like (formed at subsequent manufacturing steps).

Details regarding an integrated circuit (IC) manufacturing system (e.g., system 600 of FIG. 6), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a circuit includes a reference node configured to carry a reference voltage level, a first node configured to carry a signal having a first voltage level or the reference voltage level, a second node configured to carry a power supply voltage having a power supply voltage level in a power-on mode and the reference voltage level in a power-off mode, and a plurality of transistors coupled in series between the first node and the reference node. Each transistor of the plurality of transistors is configured to receive a corresponding control signal of a plurality of control signals, and each control signal of the plurality of control signals has a first value based on the power supply voltage in the power-on mode and a second value based on the signal in the power-off mode. In some embodiments, a control signal of the plurality of control signals has a third value based on the signal in the power-on mode. In some embodiments, the circuit further includes a voltage regulator coupled between the first node and the reference node, the voltage regulator configured to output a gate signal based on the signal, and a gate control circuit configured to output the plurality of control signals further based on the gate signal. In some embodiments, the voltage regulator is configured to output the gate signal having a value substantially equal to one half of the first voltage level. In some embodiments, the voltage regulator is configured to output the gate signal as one gate signal of a plurality of gate signals, the plurality of gate signals having a number of gate signals, and the plurality of gate signals has a plurality of values substantially equal to multiples of the first voltage level divided by the number of gate signals plus one. In some embodiments, the voltage regulator includes a source follower. In some embodiments, the gate control circuit is configured to output each control signal of the plurality of control signals having the power supply voltage level as the first value. In some embodiments, the plurality of transistors includes a first transistor and a second transistor, the first transistor being coupled between the first node and the second transistor, and the gate control circuit is configured to output either the signal or the power supply voltage level as a first control signal of the plurality of control signals to the first transistor of the plurality of transistors. In some embodiments, the gate control circuit is configured to output the first control signal of the plurality of control signals having the first voltage level when the signal has the first voltage level. In some embodiments, the gate control circuit is configured to output the gate signal to the second transistor of the plurality of transistors in the power-off mode. In some embodiments, the circuit further includes a pull-down driver coupled between the plurality of transistors and the reference node.

In some embodiments, an IC device includes an input pad configured to receive an input signal, a conductor configured to carry a power supply voltage, a gate control circuit configured to generate a first control signal and a second control signal, each of the first control signal and the second control signal being based on the power supply voltage in a power-on mode and based on the input signal in a power-off mode, a first transistor coupled with the input pad, the first transistor comprising a gate configured to receive the first control signal, and a second transistor coupled in series with the first transistor, the second transistor comprising a gate configured to receive the second control signal. In some embodiments, the IC device further includes a voltage regulator, the voltage regulator including a voltage divider configured to divide the input signal and a third transistor configured to receive the divided input signal and output a gate signal having a value of the divided input signal. In some embodiments, the gate control circuit includes a fourth transistor configured to output the gate signal as the second control signal in the power-off mode. In some embodiments, the gate control circuit includes a third transistor configured to output the power supply voltage as the second control signal in the power-on mode. In some embodiments, the gate control circuit includes a cross-coupled transistor pair configured to output either the input signal or the second control signal as the first control signal.

In some embodiments, a method of controlling a node of a circuit include receiving a signal at the node, in response to a power supply of the circuit having a power supply voltage level, using the power supply voltage to control coupling the node to a pull-down driver, and, in response to the power supply of the circuit having a reference voltage level, using the signal to control coupling the node to the pull-down driver. In some embodiments, receiving the signal includes receiving the signal having a voltage level greater than the power supply voltage level. In some embodiments, each of using the power supply voltage to control coupling the node to the pull-down driver and using the signal to control coupling the node to the pull-down driver includes controlling a plurality of transistors with a plurality of control signals. In some embodiments, controlling the plurality of transistors with the plurality of control signals includes controlling voltages across each transistor of the plurality of transistors to be less than or substantially equal to a maximum operating voltage of the plurality of transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
   a reference node configured to carry a reference voltage level;
   a first node configured to carry a signal having a first voltage level or the reference voltage level;
   a second node configured to carry a power supply voltage having a power supply voltage level in a power-on mode and having the reference voltage level in a power-off mode;
   a gate control circuit coupled to each of the reference node, the first node, and the second node, wherein the gate control circuit comprises a plurality of transistor pairs configured to output a corresponding plurality of control signals; and
   a plurality of transistors coupled in series between the first node and the reference node, each transistor of the plurality of transistors being configured to receive a corresponding control signal of the plurality of control signals,
   wherein a first transistor pair of the plurality of transistor pairs is configured to generate a first control signal of the plurality of control signals having a first value based on the power supply voltage in the power-on mode and a second value equal to the first voltage level of the signal in the power-off mode.

2. The circuit of claim 1, wherein the first transistor pair of the plurality of transistor pairs is configured to generate the first control signal of the plurality of control signals further having the second value in the power-on mode.

3. The circuit of claim 1, further comprising:
a voltage regulator coupled between the first node and the reference node, the voltage regulator configured to output a gate signal based on the signal,
wherein the plurality of transistor pairs of the gate control circuit is configured to output the plurality of control signals further based on the gate signal.

4. The circuit of claim 3, wherein the voltage regulator is configured to output the gate signal having a value substantially equal to one half of the first voltage level.

5. The circuit of claim 3, wherein
the voltage regulator is configured to output the gate signal as one gate signal of a plurality of gate signals, the plurality of gate signals having a number of gate signals, and
the plurality of gate signals has a plurality of values substantially equal to multiples of the first voltage level divided by the number of gate signals plus one.

6. The circuit of claim 3, wherein the voltage regulator comprises a source follower.

7. The circuit of claim 3, wherein
the plurality of transistors includes a first transistor and a second transistor, the first transistor being coupled between the first node and the second transistor, and
the plurality of transistor pairs of the gate control circuit is configured to output the first control signal of the plurality of control signals by coupling either the first node, the second node, or the voltage regulator to the first transistor of the plurality of transistors.

8. The circuit of claim 7, wherein the first transistor pair of the plurality of transistor pairs of the gate control circuit is configured to output the first control signal of the plurality of control signals having the reference voltage level when the signal has the reference voltage level in the power-off mode.

9. The circuit of claim 7, wherein the plurality of transistor pairs of the gate control circuit is configured to output the gate signal to the second transistor of the plurality of transistors in the power-off mode.

10. The circuit of claim 1, wherein the plurality of transistor pairs of the gate control circuit is configured to output each control signal of the plurality of control signals having the power supply voltage level as the first value.

11. The circuit of claim 1, further comprising a pull-down driver coupled between the plurality of transistors and the reference node.

12. An integrated circuit (IC) device comprising:
an input pad configured to receive an input signal;
a conductor configured to carry a power supply voltage;
a voltage regulator comprising a voltage divider configured to generate a divided input signal from the input signal;
a gate control circuit configured to generate first and second control signals, the gate control circuit comprising:
first and second transistors configured to generate the second control signal either as the power supply voltage or based on the divided input signal; and
third and fourth cross-coupled transistors configured to selectively generate the first control signal as each of the input signal and the second control signal;

a fifth transistor coupled with the input pad, the first transistor comprising a gate configured to receive the first control signal;
a sixth transistor coupled in series with the fifth transistor, the sixth transistor comprising a gate configured to receive the second control signal; and
a pull-down driver responsive to the input signal and coupled between the sixth transistor and a reference voltage conductor.

13. The IC device of claim 12, wherein the voltage regulator
further comprises a seventh transistor configured to receive the divided input signal and output a gate signal having a value of the divided input signal.

14. The IC device of claim 13, wherein the first transistor of the gate control circuit is configured to output the gate signal as the second control signal based on the divided input signal.

15. The IC device of claim 14, wherein the second transistor of the gate control circuit is configured to output the power supply voltage as the second control signal.

16. The IC device of claim 12, wherein drain terminals of the cross-coupled third and fourth transistors are coupled to the gate of the fifth transistor.

17. A method of controlling a node of a circuit, the method comprising:
receiving a signal at a voltage divider of a voltage regulator coupled to the node;
outputting, from the voltage regulator, a plurality of gate signals based on the signal divided by the voltage divider;
receiving, at a plurality of transistor pairs, the signal, the plurality of gate signals, and a power supply of the circuit;
outputting, from the plurality of transistor pairs, a plurality of control signals based on the signal, the plurality of gate signals, and the power supply of the circuit; and
coupling, with a plurality of transistors, the node to a pull-down driver in response to the plurality of control signals,
wherein
in response to the power supply of the circuit having a power supply voltage level, the outputting the plurality of control signals is based on the power supply voltage, and
in response to the power supply of the circuit having a reference voltage level, the outputting the plurality of control signals is based on the signal and comprises outputting a first control signal of the plurality of control signals having a voltage level of the signal greater than the reference voltage level.

18. The method of claim 17, wherein the receiving the signal comprises receiving the signal having the voltage level greater than the power supply voltage level.

19. The method of claim 17, wherein the coupling the node to the pull-down driver comprises controlling voltages across each transistor of the plurality of transistors to be less than or substantially equal to a maximum operating voltage of the plurality of transistors.

20. The method of claim 17, wherein the outputting the plurality of gate signals from the voltage regulator comprises operating a plurality of source followers.

* * * * *